United States Patent [19]

Nowlin

[11] 4,443,768

[45] Apr. 17, 1984

[54] AMPLITUDE- AND RISE-TIME-COMPENSATED FILTERS

[75] Inventor: Charles H. Nowlin, Oak Ridge, Tenn.

[73] Assignee: The United States of America as represented by the United States Department of Energy, Washington, D.C.

[21] Appl. No.: 297,208

[22] Filed: Aug. 28, 1981

[51] Int. Cl.³ .............................................. H03K 6/00
[52] U.S. Cl. .................................... 328/167; 328/127; 328/159
[58] Field of Search ............... 328/167, 127, 158, 159; 307/517, 351, 354

[56] References Cited

U.S. PATENT DOCUMENTS

| | | | |
|---|---|---|---|
| 3,073,972 | 1/1963 | Jenkins | 307/517 |
| 3,252,098 | 5/1966 | Schlaepfer | 307/351 |
| 3,781,692 | 12/1973 | Escoffer | 307/517 |
| 3,961,274 | 6/1976 | Jones et al. | 328/167 |
| 4,206,474 | 6/1980 | Hermann et al. | 328/167 |

OTHER PUBLICATIONS

"Pulse Timing System", R. L. Chase, *Review of Scientific Instruments*, vol. 39, No. 9 (pp. 1318–1326).
"A Leading-Edge Time Pickoff Circuit", S. Kinbara et al, *Nuclear Instruments and Methods*, (1969), pp. 61–266.
*Pulse and Digital Circuits*, J. Milman et al, McGraw-Hill, 1956 (pp. 35–36).
ORTEC Application Note AN 31 (1970), p. 3.
ORTEC AN 41 "Techniques for Improved Time Spectroscopy".

Van Valkenburg, M. E., *Network Analysis*, (2nd Ed.), Prentice Hall 1964.
Seshu, S & Balabania, N., *Linear Network Analysis*, Wiley, 1959.
Brown, R. & Nilsson, Jr., *Introduction to Linear Systems Analysis*, Wiley, 1962 (pp. 303–345, 217).
Papoulis, A., *Probability, Random Variables and Stochastic Processes*, McGraw-Hill, 1965.
Churchill, R. V., *Introduction to Complex Variables and Applications*, McGraw-Hill (1948) (pp. 122–129).
ORTEC 934 Quad Constant-Fraction 100-MHz Discriminator, 8/23/78.
ORTEC Model 455 Constant Fraction Timing Single Channel Analyzer 1970.

*Primary Examiner*—John S. Heyman
*Attorney, Agent, or Firm*—David E. Breeden; Stephen D. Hamel; Michael F. Esposito

[57] ABSTRACT

An amplitude-compensated rise-time-compensated filter for a pulse time-of-occurrence (TOOC) measurement system is disclosed. The filter converts an input pulse, having the characteristics of random amplitudes and random, non-zero rise times, to a bipolar output pulse wherein the output pulse has a zero-crossing time that is independent of the rise time and amplitude of the input pulse. The filter differentiates the input pulse, along the linear leading edge of the input pulse, and subtracts therefrom a pulse fractionally proportional to the input pulse. The filter of the present invention can use discrete circuit components and avoids the use of delay lines.

18 Claims, 15 Drawing Figures

AMPLITUDE- AND RISE-TIME-COMPENSATED FILTERS

This invention is a result of a contract with the United States Department of Energy.

BACKGROUND OF THE INVENTION

1. Field of the Invention

The invention relates to electrical filters for use in a system for measuring the time of occurrence of electrical pulses. The filter is amplitude- and rise-time-compensated.

2. Background Art

Electrical circuits that measure the time of occurrence (TOOC) of electrical pulses are known in the art. These electrical pulses are typically unipolar pulses (although bipolar pulses may also exist) characterized by a random amplitude, i.e., an amplitude that may change from pulse to pulse, and a random, non-zero rise time that may also change from pulse to pulse. The pulses are further characterized by being substantially linear over a portion of their leading edge. Generally, a TOOC measurement system comprises a filter network, which shapes the input pulses into bipolar output pulses. Such bipolar output pulses are provided to a level-crossing discriminator, which detects the zero-crossing points of the bipolar output pulses.

In order to accurately measure the time of occurrence of these electrical pulses, it is desirable that the electrical filters produce a bipolar output pulse having a zero-crossing time that is invariant with respect to the TOOC, and independent of the input pulse rise time and amplitude. That is, regardless of the rise time and amplitude of the input pulse, the bipolar output pulse has the same zero-crossing time with respect to the time of occurrence of the input pulse. As will be described further hereinbelow, this invariance ensures an accurate measurement of the time of occurrence of the input pulse.

One previously known amplitude-compensated, rise time compensated TOOC filter is the delay-line constant-fraction filter. This filter shapes the unipolar input pulses into bipolar output pulses wherein the zero-crossing time of the output pulses is insensitive to the amplitude and rise-time changes in the input pulse. The earliest reference to this filter is in the publication by Robert L. Chase, "Pulse Timing System For Use With Gamma Rays On Ge(Li) Detectors", *The Review of Scientific Instruments*, Vol. 39, No. 9, September 1968, pages 1318-1326. Such filter generally operates as follows. A fraction of the input pulse is provided to one input of a comparator, or differential amplifier. Subtracted from this fraction of the input pulse is a delayed input pulse, delayed by means of a suitable delay line. The output signal thus represents the fraction of the input pulse minus the actual input pulse that is delayed a suitable time period. It can be seen that, regardless of the rise time or amplitude of the input pulse (provided the network parameters are adequately adjusted to ensure that the zero-crossing time occurs during the linear leading edge of the input pulse), the zero-crossing time of the output pulse will remain constant.

The troublesome component in the delay-line constant-fraction filter is the delay line. It is typically fifty feet (50') long, occupies several cubic inches of space, and is time-consuming and expensive to fabricate. Connections to other circuit components require manipulation of a relatively long cable. Because delay lines must be changed physically several times in the course of adjusting the filter to a specific application, a stockpile of delay lines of different lengths is required to adjust the filter to specific applications.

Another filter circuit that provides a bipolar output signal is described in a publication by Kinbara and Kumahara, "A Leading-Edge Time Pickoff Circuit", *Nuclear Instruments and Methods* 67, (1969), pages 261-266. There, an input-pulse signal is separated into two channels which consist of a delay line and a differentiating RC network. The signals from both the delay line and the differentiating circuit are applied to input terminals of an amplitude comparator so as to determine the time when they are equal. Such circuit maintains the disadvantage of a delay line, as described above.

SUMMARY OF THE INVENTION

The present invention provides for a TOOC measurement system that includes a filter network that is more compact, less expensive, and easier to build and install than are the prior art filters which must include delay lines. In particular, the present invention comprises a filter network capable of use in a TOOC measurement system that converts input pulses, representing the occurrence of events, having random, non-zero rise times and random amplitudes, into bipolar output pulses having zero-crossing times that are invariant with respect to the TOOC's, regardless of the input-pulse rise times and amplitudes. The zero-crossing time of the bipolar output pulse occurs at a predetermined time after the occurrence of the input pulse. The filter network may use elementary and discrete circuit components, such as resistors, capacitors, and, in certain embodiments, inductors; but it avoids the necessity of using costly and cumbersome delay lines.

The filter network of the present invention provides for differentiating the input pulse, along the linear leading edge of the input pulse, and for substracting from the differentiated pulse a pulse that is fractionally proportional to the input pulse. As will be demonstrated below, such filter provides a bipolar output pulse having a zero-crossing time that is constant, regardless of the input-pulse rise time and amplitude. The circuit parameters are designed such that the zero-crossing time is less than the minimum duration of the linear leading edge of the input pulse.

In addition, the filter network of the present invention may further include a low-pass filter that passes the low frequencies of the input pulse. The low-pass filter can be a separate filter section that follows the TOOC filter, or the TOOC filter and low-pass filter can be combined in a single section filter.

Many different embodiments for the TOOC filter are described herein. One such embodiment includes an RC differentiator network that differentiates the input signal and provides the differentiated signal to one input of a differential amplifier. The input signal is also provided to a voltage-divider network, wherein the signal picked off from one of the resistors represents a fraction of the input pulse and is provided to the negative terminal of the differential amplifier. The differential amplifier is such that it subtracts the fractional input signal received from the divider network from the differentiated input signal and provides an output signal. The output signal is a bipolar pulse that, when used in a TOOC measurement system, is provided to a level-crossing discriminator to detect the zero-crossing time.

Another basic embodiment of the present invention includes a balanced-output amplifier that receives the input pulse. The balanced-output amplifier has two output terminals, providing positive and negative pulse shapes proportional to the input pulse. The positive pulse shape is differentiated by an RC network. The negative pulse shape is provided to a voltage divider. The signals are summed in a passive summing network and then provided to the output, via an isolation amplifier.

Thus, it is an object of the present invention to provide a filter network that converts an input pulse into a bipolar output pulse having a zero-crossing time independent of the rise time and amplitude characteristics of the input pulse. It is a further object of the present invention to provide such a filter network without using costly and cumbersome delay lines.

Still further, it is an object of the present invention to provide such a filter network using standard circuit components that can be readily implemented within a TOOC measurement system.

Moreover, it is an object of the present invention to provide a filter network that adequately controls the problem of random-noise-caused errors. One of the potential problems in TOOC measurements, in addition to the problem caused by variations in input-signal rise time, discussed above, is random noise that is generated in the sensor (detector) or in the very low-level stages of signal amplification. This noise is typically present at the input to the TOOC filter. The prior art delay-line constant-fraction filter, discussed above, has been demonstrated to reduce to acceptable levels the random-noise-caused error. Thus, any practical TOOC filter that is a viable alternative to the prior art delay-line constant-fraction filter must provide substantially comparable results in reducing the effects of random noise to acceptable levels. Thus, it is an object of the present invention to provide a TOOC filter network that has a signal-to-noise ratio substantially comparable to the delay-line constant-fraction filter, yet avoid the problems inherent in such a delay-line constant-fraction filter, as were discussed above.

These and other objects of the invention will become more apparent when reference is made to the accompanying drawings and detailed description thereof.

DETAILED DESCRIPTION OF THE DRAWINGS

As discussed above, one of the principal objects of the present invention is to accurately measure the time of occurrence (TOOC) of electrical pulses that represent the occurrence of an event. These electrical pulses that represent the occurrence of an event are pulses (typically unipolar) having random amplitudes that may change from pulse to pulse and random, non-zero rise times that may change from pulse to pulse. These pulses are further characterized by having a substantially linear portion over at least a portion of the upward slope of the leading edge. As is used herein, the phrase "substantially linear" describes a portion of the leading edge of every continuous pulse, including those that by ordinary standards are thought to have leading edges with substantial curvature. This definition is supported by noting that, as is well known from the theory of Taylor Series in mathematics, a sufficiently short portion of any continuous curve can be represented by a straight line with proper slope and intercept. In this sense, a sufficiently short portion, beginning at the pulse TOOC, of the leading edge of every continuous pulse is defined to be "substantially linear," or simply "linear" or "linearly increasing."

Figure 1:
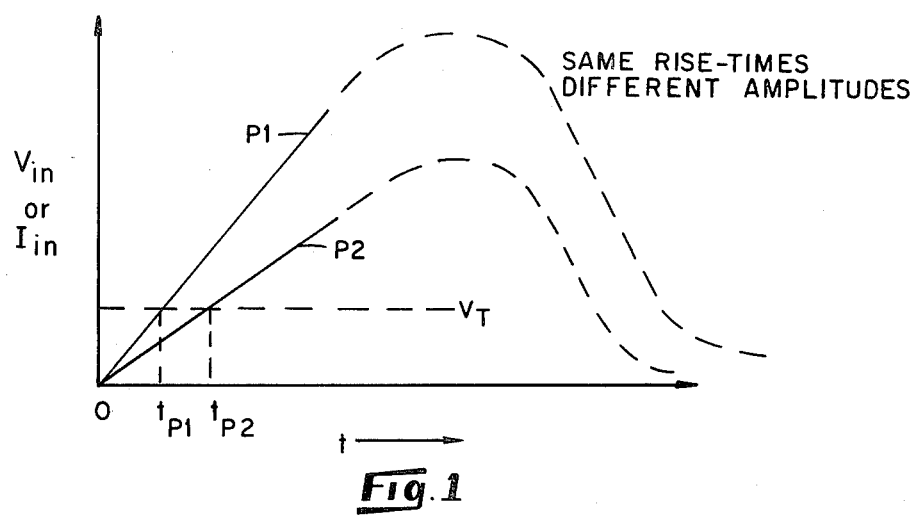
FIG. 1 is a graph depicting two typical input pulses having identical rise times, but different amplitudes.

It can be seen that if such pulses are applied directly to a threshold discriminator, or detector, the detection of the time of occurrence of such pulse will differ depending upon the pulse amplitudes or rise times. Reference should be made to FIG. 1. There, two unipolar input pulses, of the type to which the present invention relates, are shown to have the same rise times, (however that term is defined), and different amplitudes. Both pulses P1 and P2 occur at the same time, i.e., at time $t=0$. Yet, it can be observed that the time $t_{p1}$ at which P1 crosses the threshold $V_T$ is different from the time $t_{p2}$ when pulse P2 crosses the threshold $V_T$. Thus, for two input pulses, P1 and P2, occurring at the same time, a threshold detector or discriminator will detect these two pulses at different times, thus providing an inaccurate measurement of their times of occurrence.

Figure 2:
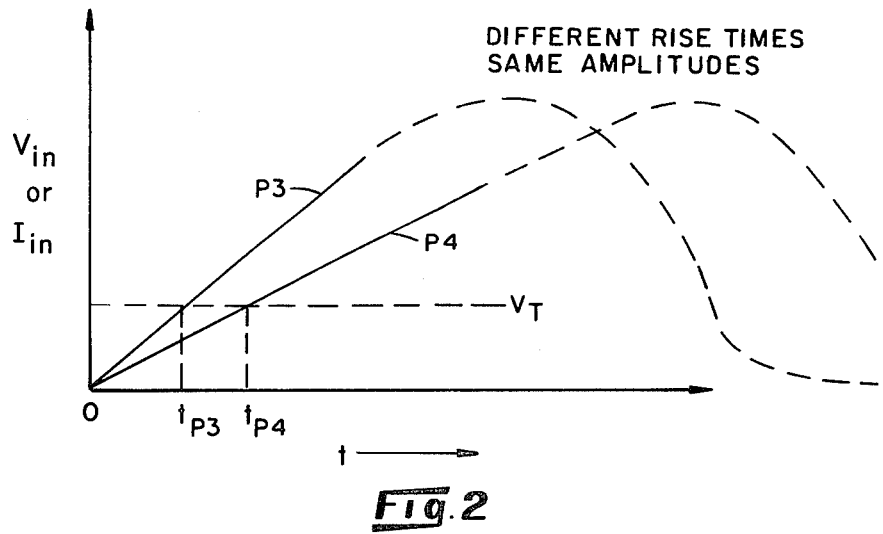
FIG. 2 is a graph depicting two typical input pulses having identical amplitudes, but different rise times.

FIG. 2 depicts two input pulses, P3, P4, having different rise times but the same amplitude. Both pulses P3 and P4 occur at the same time, $t=0$. Yet, despite their occurrence at the same time, pulses P3 and P4 cross the threshold discriminator level $V_T$ at different times, $t_{p3}$, $t_{p4}$, thus providing an inaccurate measurement.

It is thus seen that providing the unipolar input pulses directly to a discriminator will not result in an accurate TOOC measurement. Thus, it is known in the prior art that one must first provide the input pulses to a filter network, which converts the input pulses to bipolar output pulses wherein the bipolar output pulses have a zero-crossing time that is the same regardless of the input-pulse amplitude or rise time. This bipolar output pulse is then applied to the level-crossing discriminator.

Although FIGS. 1 and 2 depict the input pulses as unipolar, it should be apparent that the present invention will also be applicable for input pulses that have one or more zero-crossings, so long as the input pulse has a linearly increasing leading edge. For such pulse, the output pulse, to be described below, will have an additional zero-crossing (during the linearly increasing leading edge) and the zero-crossing discriminator, to be described below, will be armed just before that first zero-crossing. Additional logic will be needed to prevent the discriminator firing on later zero-crossings.

The present invention includes a filter network for shaping the input pulse to a bipolar output pulse by differentiating it, i.e., taking its derivative, and then subtracting from that derivative signal, a signal fractionally proportional to the non-differentiated pulse. The terms "fractionally proportional" and "fraction" as used herein are not limited to numbers less than one. They could refer to any real number greater than zero.

Figure 3:
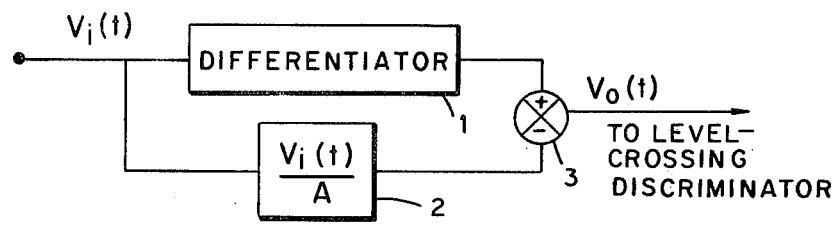
FIG. 3 is a schematic representation of the present filter invention.

For example, the "fraction" could be greater than one, or even a whole number such as $10^9$. The value of the fraction may depend on the circuitry. There may be certain circuits which require a restricted range of the fraction, and others which require the full range. The basic concept of this filter is indicated in FIG. 3, wherein the input signal $v_i(t)$ is differentiated by a differentiator 1. The input signal is also divided by a constant A, at numeral 2, to provide a fraction of the input signal to a comparator 3 which subtracts the fraction of the input signal from the differentiated signal to form the output pulse $v_0(t)$. As indicated in FIG. 1, the input signals are voltage signals, but could also be current pulses. A number of different embodiments for providing the function of FIG. 1 will be described below. First, a brief discussion of the theory is in order.

Figure 4:
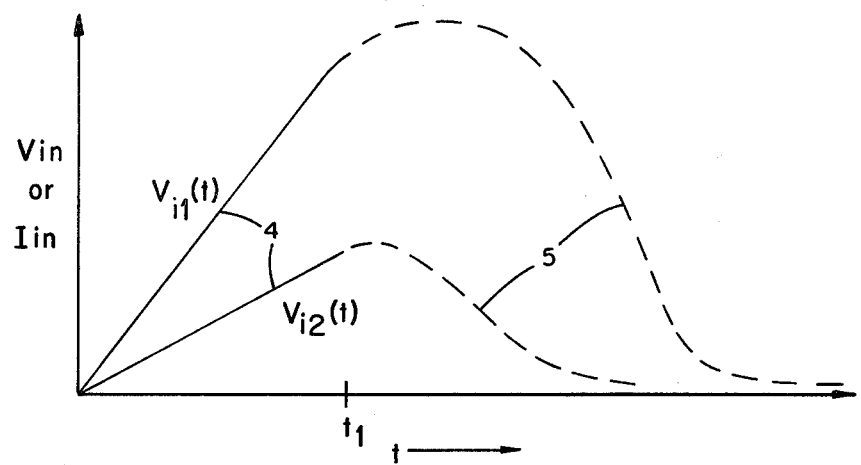
FIG. 4 is a graph of two typical unipolar input pulses.

The random electrical input pulses, such as $v_{i1}(t)$ and $v_{i2}(t)$, frequently encountered in TOOC measurements are repeated in FIG. 4. These electrical pulses are either voltage- or current waveforms that are functions of time. These typical pulses have linearly increasing leading edges, 4, with non-zero rise times that may change in a random, unpredictable manner from pulse to pulse. One input pulse, $v_{i1}(t)$ is shown to have a slope, or derivative, that is greater than the slope, or derivative, of $v_{i2}(t)$. The amplitude of $v_{i1}(t)$ is also substantially greater than is the amplitude of $v_{i2}(t)$. Beyond the linear portion of the input pulses, as at 5, the exact shape of the pulses are not important.

Figure 5:
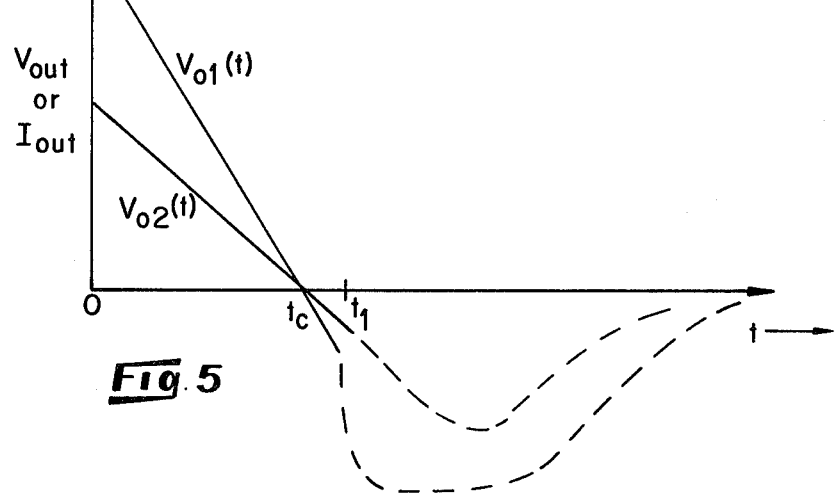
FIG. 5 is a graph of two typical bipolar output pulses.

FIG. 5 depicts the output pulses $v_{01}(t)$, $v_{02}(t)$ for each of the two input pulses shown in FIG. 4, using the circuit of FIG. 3. As shown in FIG. 5, each output pulse is a bipolar pulse and the zero-crossing point, or time, $t_c$, is identical for both input pulses. The zero-crossing times, $t_c$, of the output pulses are identical regardless of the different amplitudes of the input pulse and regardless of the different rise times of the input pulse.

For example, during the entire linear leading edge 4 of the input pulse $v_{i1}(t)$, the derivative is constant and the output pulse, $v_{0i}(t)$ is at its maximum at time $t=0$. The output pulse falls linearly to zero (at time $t_c$) at a rate proportional to the derivative, or slope, of the input pulse. Thus, with respect to the input pulse $v_{i1}(t)$, wherein the derivative or slope of the input pulse is relatively steep, the output pulse $v_{0i}(t)$ at time $t=0$ has a large value which drops at a relatively high rate until it crosses the zero point $t_c$. With respect to the input pulse $v_{i2}(t)$, the slope or derivative of the pulse is relatively smaller and thus the output pulse drops at a lower rate until it crosses the zero point at $t_c$. The zero-crossing time, $t_c$, of both output pulses is the same, and is unchanged by changes in input signal rise time, so long as the components of the filter, to be described hereinbelow, are adjusted so that the zero-crossing time $t_c$, is less than $t_1$, where $t_1$ is the minimum duration of the linear portion of the typical pulse for the set of all expected pulses.

It should also be apparent that the zero-crossing times $t_c$ of the output pulses of FIG. 5 are independent of the amplitude of the input pulses of FIG. 4. For all input pulses of substantially the same shape, all of the output pulses will be of substantially the same shape, albeit different from the input pulses. If the input pulses are of substantially the same shape, but have different amplitudes, then the output pulses will have substantially the same shape, but have different amplitudes. Regardless of the differences in amplitude, the zero-crossing time $t_c$ will remain the same.

As discussed above, a complete TOOC measurement system comprises a TOOC filter, shown schematically in FIG. 3, which converts the input pulse, having a linear leading edge, as shown in FIG. 4, into a bipolar output pulse, as shown in FIG. 5, wherein the zero-crossing point $t_c$ of the bipolar output pulse is identical and independent of the rise time and amplitude of the input pulse. In addition to the TOOC filter, a level-crossing discriminator, as indicated generally in FIG. 3, is provided to receive the bipolar output pulses. Level-crossing discriminators are well-known in the art and they can be any device that emits a time-marker pulse whenever the input signal to the discriminator crosses a predetermined level. In the present case, the predetermined level is the zero-level. Thus, the level-crossing discriminator detects the bipolar output pulse by detecting the time at which the bipolar output pulse crosses zero. As discussed above, if the input pulse has one or more zero-crossings, the output pulse will also have more than one zero-crossing. In such case, the level-crossing discriminator will be designed to detect only the first zero-crossing time, and will ignore subsequent zero-crossings. Such a design would be obvious to one of ordinary skill in the art.

Many different circuit arrangements for the TOOC filter, shown schematically in FIG. 3 can be designed. The filter arrangement of FIG. 6 will first be described, since it is the most basic.

Figure 6:
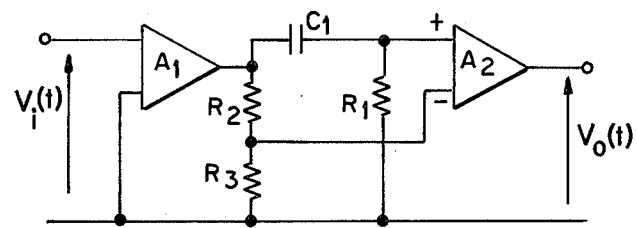
FIGS. 6-14 are circuit diagrams of various embodiments of the present filter invention.

With reference to FIG. 6, isolation amplifier $A_1$ isolates the $R_1$-$C_1$ differentiator circuit and the $R_2$-$R_3$ voltage divider from the signal source $v_i(t)$. The input signal, $v_i(t)$, is of the type described in FIG. 4. The filter is made up of $R_1$, $C_1$, $R_2$ and $R_3$, along with the differential-input amplifier $A_2$. The components $R_1$ and $C_1$ are adjusted to supply a signal proportional to the derivative of the input signal to the positive terminal of the $A_2$ differential amplifier. A fraction of the input signal is applied directly to the negative terminal of the $A_2$ amplifier via the voltage divider formed by resistors $R_2$ and $R_3$. Because the $A_2$ amplifier is a differential amplifier, its output signal $v_0(t)$ is proportional to the difference between the voltages applied at the positive and negative input terminals. Hence, its output signal, $v_0(t)$ is proportional to the derivative of the input signal less a fraction of the input signal itself.

As is well known, RC differentiators are not exact differentiators. However, the error caused by the inexact differentiation process is of no consequence if $t_C < t_1$, where $t_c$ is the zero-crossing time of the output signal $v_0(t)$ and $t_1$ is the minimum duration of the linear portion of the typical input pulse for the set of all expected input pulses. The linearly increasing portion of the signal $V_i(t)$ in FIG. 6 is known in the literature (e.g., Millman, J. and Taub, H., *Pulse and Digital Circuits*, McGraw-Hill, 1956, pp. 35-36) as a "ramp" with, for example, slope $\alpha$. During the linearly increasing (ramp) portion of $V_i(t)$, both the signal amplitude and rise time are reflected in the parameter $\alpha$. If, for simplicity in the present discussion, we take the pulse TOOC to be zero, the input pulse is described mathematically as $$V_i(t) = \alpha t u(t)$$

during the time period $t < t_1$. The auxiliary function, $u(t)$, is the unit step function, and $u(t)=0$ if $t<0$ and $u(t)=1$ if $t>0$. The response of RC differentiators to ramp inputs is described by Millman and Taub, (pp.

35–36). For this ramp input signal, the signal at the positive terminal of $A_2$ in FIG. 6 is $$V_+(t) = \alpha R_1 C_1 (1 - e^{-t/R_1 C_1}) u(t).$$

Figure 15:
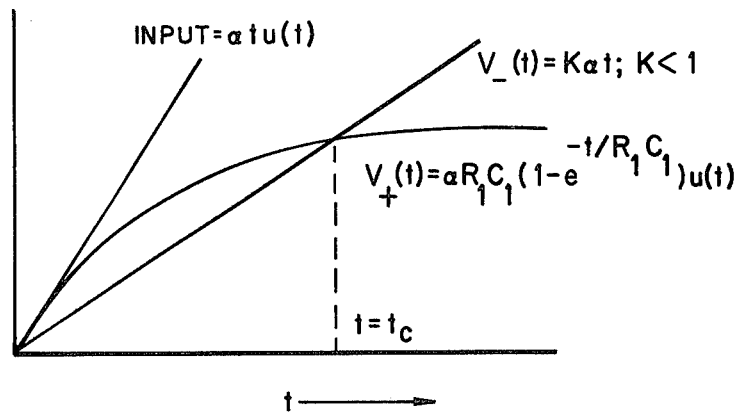
FIG. 15 is a graph depicting the input signal, and the signals at the positive and negative inputs to amplifier $A_2$ of FIG. 6.

The signal applied to the negative terminal of $A_2$ is $$V_-(t) = K\alpha t u(t)$$

where $K = R_3/(R_2 + R_3) < 1$. The output signal $V_o(t)$ is proportional to the difference between $V_+(t)$ and $V_-(t)$. Because $\alpha$ affects $V_+(t)$ and $V_-(t)$ only as an amplitude multiplier, it affects $V_o(t)$ only as an amplitude multiplier, and hence has no effect on the zero-crossing time of $V_o(t)$. It is clear that $V_o(t)$ does cross zero because for $0 < t << R_1 C_1$, $V_+(t) \approx \alpha t u(t) > K\alpha t u(t) = V_-(t)$; whereas for $t >> R_1 C_1/K$, $V_+(t) \approx \alpha R_1 C_1 u(t) << K \alpha t u(t) = V_-(t)$. The relationship between $V_+(t)$ and $V_-(t)$ as functions of time is shown in FIG. 15.

The approximate equation for $V_+(t)$ used in the above inequalities is the linear term of the Taylor-series expansion for $V_+(t)$. Clearly $t_c$ is the time when $V_+(t_c) = V_{31}(t_c)$, and $t_c$ always can be made to occur at any time during the linear leading edge of the input pulse by the use of the proper values of K and $R_1 C_1$. Hence, the zero-crossing time of $V_o(t)$ is amplitude- and rise-time-compensated for RC differentiation if $t_c < t_1$, so that the input signal can be characterized as a ramp until after $t_c$. The use of the low-pass filters, in addition to the basic embodiment of FIG. 6, may delay the zero-crossing time of the resulting output signal; but the parameters K and $R_1 C_1$ can be adjusted to obtain whatever overall zero-crossing time is desired.

Errors in TOOC measurements are also caused by continuous random noise that is generated in the sensor (detector) or in the very low-level stages of signal amplification. This noise is present at the input to the TOOC filter. These noise-caused errors are independent of and in addition to those caused by amplitude- and rise-time variations. Hence, the total mean-square error of the TOOC measurement is the sum of the mean-square error caused by only the amplitude- and rise-time variations and the mean-square error caused by only the continuous random noise. A practical TOOC filter must reduce to acceptable levels the errors caused by all of these errors. A satisfactory comparison of the random-noise-caused error of this filter with that of the prior art delay-line constant-fraction filter is helpful in showing that the present invention is a practical device. Hence, the problem of random-noise-caused errors in TOOC measurements will be considered next. The control of these errors leads to filter modifications and to optimum filter component values.

The mean square of the TOOC error that results from continuous random noise is known from the prior art to be directly proportional to the mean square of the noise at the input to the level-crossing discriminator and inversely proportional to the square of the time-slope of the signal when it crosses zero at the input to the discriminator. This relationship is known as the triangle rule. (ORTEC Application Note AN 31, (1970), p. 3). The reciprocal of the root-mean-square value of this TOOC error is hereinafter called the signal-to-noise ratio.

The continuous random noise at the input to a TOOC filter is usually "white noise." Such noise has equal energy in all portions of the signal spectrum. Hence, unless a TOOC filter has limited bandwidth, the random-noise-caused error in the TOOC measurement will be infinite.

Figure 7:
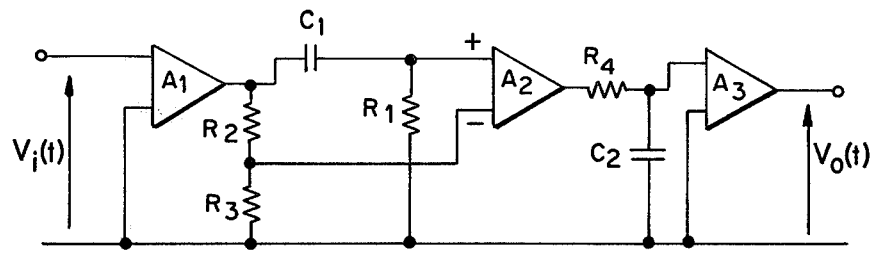

The basic embodiment of the TOOC filter shown in FIG. 6 does not have limited bandwidth. It is an all-pass filter. High-frequency noise is transmitted through both signal paths with little attenuation. Low-frequency noise is transmitted through the attenuator formed by $R_2$ and $R_3$. To limit the noise bandwidth and improve the signal-to-noise ratio, the filter of FIG. 6 is modified to that of FIG. 7. FIG. 7 is identical to that of FIG. 6 except that a low-pass filter, made up of resistor $R_4$ and capacitor $C_2$, is added as a separate stage to the FIG. 6 filter. The amplifier $A_3$ is an isolation amplifier that isolates the low-pass filter from any load imposed on the output terminals.

Even though the filter of FIG. 7 has limited bandwidth, some choices of component values result in a larger signal-to-noise ratio than do others. The choices that result in the largest signal-to-noise ratio, have been designated hereinafter as the optimum component values. It is easier to calculate these component values than it is to determine them experimentally.

Knowledge of the filter transfer function is essential to calculating the signal-to-noise ratio and the optimum component values. The filter transfer function is the ratio of the Laplace transform of $V_o(t)$ to the Laplace transform of $V_i(t)$. Knowing the filter transfer function makes it possible to calculate the filter ramp response, to specify or determine its exact zero-crossing time, to calculate the time slope of the ramp response at the zero-crossing time, and to calculate the mean-square noise at the filter output. These calculations, together with the triangle rule, make it possible to calculate the signal-to-noise ratio for any choice of component values. The optimum component values were determined by a computer-assisted systematic search for the single set of values that results in the maximum signal-to-noise ratio.

Techniques for calculating such transfer functions are described in great detail in many books; e.g., Van Valkenburg, M. E., *Network Analysis* (2nd ed.), Prentice Hall, 1964; Seshu, S. and Balabanian, N., *Linear Network Analysis*, Wiley, 1959; and Brown R. and Nilsson, J., *Introduction to Linear Systems Analysis*, Wiley, 1962. By the application of these techniques to the network of FIG. 7, the transfer function is found to be $$H(s) = \frac{G(s - a)}{(s + b)(s + c)} \qquad (1)$$

where s is the Laplace transform variable,
$G = A_1 A_2 A_3 c R_2/(R_2 + R_3)$
$b = (R_1 C_1)^{-1}$
$c = (R_4 C_2)^{-1}$
$a = (R_3/R_2) b$ and where $A_1$, $A_2$ and $A_3$ are the amplifier gains. The amplifiers are assumed to be broad-band amplifiers which do not affect the frequency response of the overall filter.

The response of the filter of FIG. 7 is calculated for $0 < t < t_1$; (i.e., during the linearly increasing leading edge of the input signal), by multiplying H(s) by $\alpha/s^2$, the Laplace transform of $\alpha t u(t)$, expanding the result in partial fractions, and using a Laplace transform table to determine the Laplace transform inverse of each term. This technique is standard for calculating the time-response of a filter. For $b \neq c$, the result of the output signal is $$V_o(t) = Ga f(t) \qquad (2)$$

where $$f(t) = \left[ \left(1 + \frac{a}{b}\right) BEX - \left(1 + \frac{a}{c}\right) CEX + \left(\frac{a}{c} - \frac{a}{b}\right) t \right] u(t),$$

and for its time derivative is $$\dot{V}_o(t) = Ga \dot{f}(t) \qquad (3)$$

where $$\dot{f}(t) = \frac{[c(a+b)e^{-bt} - b(a+c)e^{-ct} - a(c-b)]u(t)}{(bc^2 - cb^2)}.$$

The parameter $BEX = (1 - e^{-bt})/b$ and the parameter $CEX = (1 - e^{-ct})/c$. If b exactly equals c, different equations for $V_o(t)$ and $\dot{V}_o(t)$ are obtained, again by standard techniques. The derivation of such special equations does not seem worth the time because Equations 2 and 3 are valid whenever the difference between b and c, however small, is non-zero. Because the computer used, (an APPLE II Plus), carries nine decimal digits, there is no difficulty with calculations where the difference between b and c is only 0.1 percent. This difference is so small that $b = c$ for all practical purposes.

The filter transfer function H(s), together with the noise-power spectral density is used also to calculate the mean-square noise at the filter output. Calculation of filter noise properties is described in Brown and Nilsson, (pp. 303–345) and in Papoulis, A., *Probability, Random Variables and Stochastic Processes*, McGraw-Hill (1965). The noise-power spectral density for white noise is a constant, $K_w$ (Brown and Nilsson, p. 328). Then, the output noise power spectral density for the filter is $$N(j\omega) = K_w H(j\omega) H(-j\omega) \qquad (4)$$

where $H(j\omega)$ is the Fourier-transform transfer function and $j = \sqrt{-1}$. For the present network, the Fourier-transform transfer function is the same as the Laplace-transform transfer function, if $j\omega$ is substituted for s. This property is discussed by Brown and Nilsson, p. 217. The relationship between input- and output noise-power spectral densities is discussed on pp. 337–338 of the same book. Finally, the mean-square output noise, $n_o^2$, is given by $$n_o^2 = \frac{1}{2\pi} \int_{-\infty}^{+\infty} N(j\omega) d\omega \qquad (5)$$

This equation is discussed on p. 326 of Brown and Nilsson. This integral is evaluated by using the calculus of residues, which is discussed in Churchill, R. V., *Introduction to Complex Variables and Applications*, McGraw-Hill, 1948, pp. 122–129.

For this transfer function with $b \neq c$, it is found that $$n_o^2 = G^2 K_w I_n^2 \qquad (6)$$

where $$I_n^2 = \frac{[(c+a)(c-a)/c - (b+a)(b-a)/b]}{[2(c+b)(c-b)]}$$

If b exactly equals c, different equations are obtained for $I_n^2$. For the same reasons discussed in connections with Equations 2 and 3, these equations have not been derived.

Finally, by the triangle rule, the mean-square value of the noise-caused error in the TOOC measurement is $$\sigma_t^2 = n_o^2/\dot{V}_o^2(t=t_c) = K_w I_n^2/[a\dot{f}(t=t_c)]^2 \qquad (7)$$

where $\dot{f}(t=t_c)$ is given by Equation 3 with $t = t_c$. The signal-to-noise ratio is $$S/N = 1/\sigma_t. \qquad (8)$$

To determine the signal-to-noise ratio of the filter of FIG. 7 for a given set of component values, $R_1$, $R_2$, $R_3$, $R_4$, $C_1$, and $C_2$, the parameters a, b, and c are calculated according to Equation 1. Using these values of a, b, and c, the zero-crossing time, $t_c$, is calculated from Equation 2 by solving numerically for the value of $t = t_c$, such that $V_o(t_c) = 0 = f(t_c)$. This value of $t_c$ is used, together with the previously calculated values for a, b, and c in Equation 3, to calculate $\dot{f}(t=t_c)$. The parameters a, b, and c are used in Equation 6 to calculate $I_n$. The results of these satellite calculations are used in Equation 7 to calculate $\sigma_t^2$ and, finally, its reciprocal square root, S/N, the signal-to-noise ratio.

To determine optimum component values, the above procedure is modified to calculate S/N for arbitrarily chosen $t_c$, b, c (rather than for arbitrarily chosen a, b, and c). This change is made because of the great importance of choosing $t_c < t_1$ in applications of this filter. To implement this modification, an equation is needed to calculate the parameter a from specifications of $t_c$, b, and c. The needed equation is obtained by solving $f(t=t_c) = 0$ in Equation 1 for the parameter a. This action results in $$a = [CEX - BEX]/[(BEX - t_c)/b + (t_c - CEX)/c] \qquad (9)$$

The calculation of $f(t=t_c)$, $I_n^2$, $\sigma_t^2$, and S/N proceed as previously described. For any a, b, and c, the component values are determined from Equation 1 with simple algebra.

For a single $t_c$, calculations of S/N may be made in a systematic way for various values of b and c until the parameters b and c are found, (and implicitly a via Equation 9), that result in the largest S/N. The preferred system is to lay down a 3-point-by-3-point grid of points somewhere in the quadrant of the b, c, plane where $b > 0$ and $c > 0$. The parameter b is specified as differing from c by at least 0.1 percent to avoid the need for special equations instead of Equations 2, 3, and 6. The S/N ratio is calculated for each of the nine points on the grid. The grid is moved, without changing the distance between points on the grid, until S/N for the center point is as large as, or larger than, that for any of the other eight points. Then the distance between grid points is divided by two and the process is repeated. The iteration is stopped when all of the following conditions are met: (1) the grid is "centered" on the largest S/N as described above, (2) the maximum percentage variation of S/N over all nine points is less than 0.1 percent, and (3) the distance between points is less than 0.1 percent of the smaller of the two coordinates of the center point. The coordinates of this center point are the optimum values of b and c. The starting location of the grid and the starting distance between the points of the grid affect speed of convergence but do not affect the final values for the optimum b and c for a chosen $t_c$. From the optimum $t_c$, b, and c, the optimum value for a is calculated according to Equation 9.

The result of this iterative calculation is that the maximum S/N for the network of FIG. 7 is obtained for $b=c=2.37/t_c$, (within the tolerance discussed above in connection with Equations 2 and 3). Then it is possible to calculate, using Equation 9, that $a=2.09/t_c$. The S/N for these parameter values is $$0.372a\sqrt{t_c}/\sqrt{K_w}. \quad (10)$$

The dependence of the maximum S/N on $\sqrt{t_c}$ and of the optimum values of a, b, and c on $1/t_c$ were first observed as a result of iterative calculations made for different values of $t_c$. Later these relationships were derived analytically from Equations 2, 3, and 6.

To show that the present invention is indeed a practical filter, it is essential to compare the maximum signal-to-noise ratio for the present filter with the best obtainable using a delay-line constant-fraction filter. The delay-line constant-fraction filter is an all-pass filter. All frequencies are transmitted through the delay line and through the attenuator that obtains the fraction of the non-delayed pulse. Hence, for white noise at the input, infinite mean-squared noise is obtained at the output. A low-pass filter must be used in conjunction with the delay-line constant-friction filter to make the overall signal-to-noise ratio worthy of comparison with that of the invention filter. Such a low-pass filter is likely to occur in practical systems only because of the limited bandwidth of needed amplifiers. The need for such a filter has not been discussed in the literature. Nevertheless, to create a competitive standard of comparison, the optimum design parameters were calculated, along with the maximum signal-to-noise ratio for a standard delay-line constant-fraction filter in cascade with an RC low-pass filter. The same methods were used as discussed in connection with Equations 1–9 above. It was found that the maximum signal-to-noise ratio for such a TOOC filter is $$S/N = 0.385a\sqrt{t_c}/\sqrt{K_w}. \quad (11)$$

Comparison of Equation 11 with Equation 10 shows that the signal-to-noise ratio for the invention filter of FIG. 7 is only 3.5 percent less than that of the optimized delay-line based filter. Furthermore, delay lines are not needed.

From these optimum values of b, c, and a, together with the relationships between them and the filter component values (see Equation 1), it has been determined that for a maximum signal-to-noise ratio, and hence for optimum performance, the components of the filter shown in FIG. 7 should be adjusted so that $$R_4C_2=R_1C_1=0.422t_c$$

and $$R_3=0.882R_2$$

and $$t_c<t_1.$$

The remaining specifications of the components may be chosen to result in an easily constructed piece of hardware. Larger values of $t_c$ result in improved signal to-noise ratios, but $t_c$ must be less than $t_1$ to retain the rise-time-compensated zero-crossing time. Furthermore, if the leading edge of the input pulse is curved in the macroscopic sense, the degree of rise-time compensation can always be continuously increased, at the expense of decreasing the signal-to-noise ratio, by decreasing $t_c$. For such pulses, the optimum $t_c$ is the one for which a further reduction in $t_c$ results in a reduction in rise-time-caused errors in the TOOC measurement which is exactly offset by the increase in random-noise-caused errors.

Figure 8:
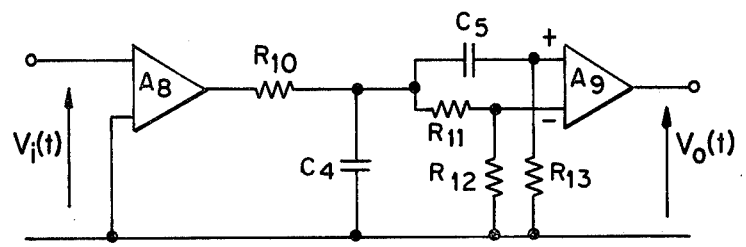

Another embodiment of the inventive filter network is depicted in FIG. 8. In this embodiment, the two filter stages, or sections, of FIG. 7 are combined into a single filter stage. The left-hand amplifier $A_8$ isolates the filter from the signal source, as with the embodiments of FIGS. 6 and 7. The filter is made up of $R_{10}$, $R_{11}$, $R_{12}$, $R_{13}$, $C_4$, $C_5$, and the differential input amplifier $A_9$. The components $R_{10}$ and $C_4$ make up a low-pass filter that improves the signal-to-noise ratio of the final signal. The components $C_5$ and $R_{13}$ form a differentiator, similar to the FIGS. 6 and 7 embodiments. The components $R_{11}$ and $R_{12}$ form a voltage divider that supplies a portion of the non-differentiated signal to the negative terminal of the differential amplifier $A_g$, as with the previous embodiments. Because the amplifier $A_9$ is a differential one, its output signal $v_0(t)$ is proportional to the derivative of the input signal less a fraction of the signal itself, both low passed by the filter $R_{10}$-$C_4$.

The transfer function for the filter of FIG. 8 is of the same form as H(s) in Equation 1. The relationships between a, b, and c and the component values for the filter of FIG. 8 are, of course, different from those for the filter of FIG. 7. At first glance, it appears that it should be straightforward to derive these relationships and to calculate the optimum component values from the optimum a, b and c previously determined for H(s). However, making b equal to c, so as to obtain the maximum signal-to-noise ratio, would require some component values in FIG. 8 to be zero and/or others to be infinite.

Making b/c different from one results in finite, non-zero values for all components of the filter of FIG. 8. Indeed, the larger (or smaller) b/c is made, compared with one, the more nearly equal become the values of both the two resistors and of the two capacitors of FIG. 8. Unfortunately, the larger (or smaller), compared with one, that b/c becomes, the smaller becomes the signal-to-noise ratio of the resulting filter. Although filters with smaller spreads of component values are more practical, the corresponding smaller signal-to-noise ratios are not desirable. Fortunately, in the present case, the spread of component values is reduced more rapidly with increasing (or decreasing) b/c than is the signal-to-noise ratio. In particular, b/c=3 results in a practical spread of component values and, for a properly chosen value of a, results in a signal-to-noise ratio that is only 3.5 percent worse than that of the filter of FIG. 7.

For b/c=3, the optimum values of a, b and c are $a=2.09/t_c$, $b=3.98/t_c$ and $c=1.33/t_c$. The corresponding component values are given by:

$$R_{10}C_4=0.475t_c; \quad R_{13}=3.05R_{10}$$

$$R_{13}C_5=0.478t_c; \quad R_{11}=R_{12}=2.5R_{10}$$

Other component values will produce the rise-time-compensated zero-crossing time but, for the most part, with worse signal-to-noise ratios. The value of one resistor, perhaps $R_{10}$, is implicitly not specified and may be chosen to obtain any specified impedance level. The dc gain, exclusive of amplifier gain, of the filter section of FIG. 8 for these component values of 0.417. In seems, at first glance, that the ratios $R_{12}/(R_{11}+R_{12})$ and $(R_{11}+R_{12})/R_{10}$ are completely arbitrary. and that these ratio could be increased to increase the dc gain. However, if these ratios are increased much beyond the values chosen, $C_5$ becomes unreasonably small compared with $C_4$; and $R_{13}$ becomes unreasonably large with respect to the other resistor values. Indeed, for a dc gain of approximately 0.56, these component values are required to be negative to obtain the optimum values of a, b, and c. The choice of the given ratios results in a practical spread of component values and in a dc gain that is nearly as large as can be obtained.

Figure 9:
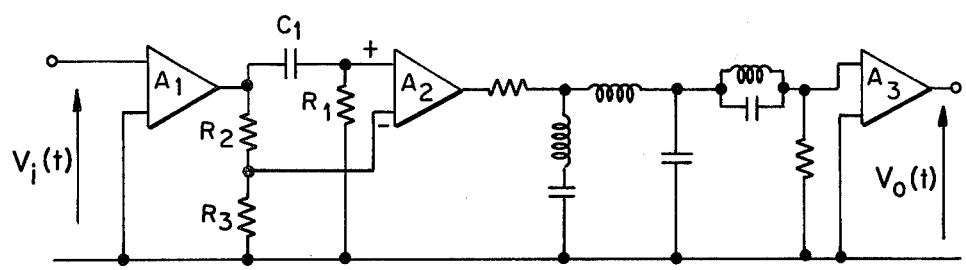
Figure 10:
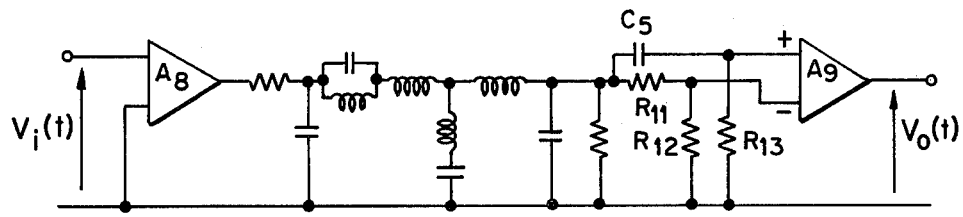

It should be apparent that the low-pass filter $R_4$-$C_2$ of FIG. 7, and the low-pass filter $R_{10}$-$C_4$ of FIG. 8, could each be substituted by more complex low-pass filter arrangements without detracting from the inventive concept. Thus, FIG. 9 depicts a filter arrangement similar to that of FIG. 7, but having the simple low-pass filter $R_4$-$C_2$ substituted by a complex RLC low-pass filter, shown in unlabeled components. Any low-pass filter, properly designed, could be so substituted. Likewise, FIG. 10 depicts a filter arrangement similar to the single-stage filter arrangement of FIG. 8, but substituting a complex RLC low-pass filter for the simple low-pass filter $R_{10}$-$C_4$.

Figure 11:
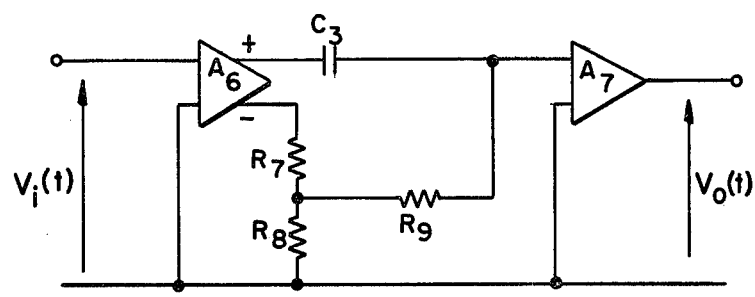

The embodiments of FIGS. 6-10 all provide for a differential input amplifier ($A_2$, $A_9$) to subtract a fraction of the undifferentiated input signal from the differentiated input signal. Other designs can be employed. FIG. 11 depicts a filter arrangement having performance equivalent to FIG. 6, but using a balanced-output amplifier $A_6$ to receive the input signal $v_i(t)$. The balanced output amplifier, $A_6$, is well-known in the art and has two output terminals (labeled "+" and "−"). The signals at these two output terminals are equal in magnitude but opposite in phase, or polarity. Hence, for the amplifier $A_6$ of FIG. 11, the signal at the "−" output terminal is the negative of the signal at the "+" output terminal. If such positive and negative signals are fed into a passive summing network, the summing network and the balanced output amplifier form a differencing network.

Thus, the balanced output amplifier $A_6$ isolates the filter from the signal source $v_i(t)$ and supplies balanced output signals to the differentiator and the voltage divider. The filter is made up of $R_7$, $R_8$, $R_9$, and $C_3$ along with the balanced output amplifier $A_6$. The voltage divider is made up of $R_7$ and $R_8$. (For maximum flexibility in adjusting $t_c$ in the case of embodiments using balanced output amplifiers, variable attenuators should be part of the differentiated signal path and of the non-differentiated signal path.) The differentiator, which also acts as a summing network, is made up of $C_3$ and $R_9$. The amplifier $A_7$ is an isolation amplifier that isolates the filter from the load. Thus, the input to the isolation amplifier is the sum of the differentiated positive input signal and the fraction of the negative input signal. The output signal $v_0(t)$ is thus the bipolar output signal as shown in FIG. 5.

The balanced-output amplifier circuit of FIG. 11 may also be used with a low-pass filter, as in the embodiments of FIGS. 6-10. Reference should be made to the network of FIG. 12. There, a filter similar to that of FIG. 11 is shown, but with a low-pass filter $R_{17}$-$C_7$ combined in a single section. The balanced-output amplifier $A_{10}$ isolates the filter from the signal source $v_i(t)$ and supplies balanced signals to the filter. The resistors $R_{14}$ and $R_{15}$ comprise a voltage divider. The differentiator is made of $C_6$ and $R_{16}$. The components $C_6$ and $R_{16}$ also form a summing network that sums the differentiated and non-differentiated currents into the resistor $R_{17}$. The components $R_{17}$ and $C_7$ make up a low-pass filter that acts on the composite signal to improve the signal-to-noise ratio. This arrangement is currently believed to be the preferred embodiment.

Figure 12:
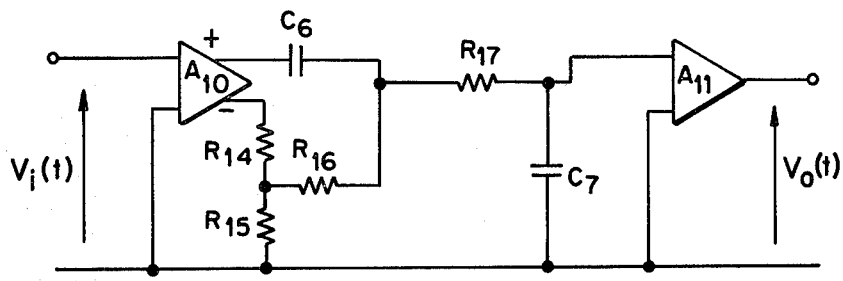

For the filter of FIG. 12, if b/c=3, then the signal-to-noise ratio is only 3.5% less than that of FIG. 7, $R_{14}$ is zero, and $R_{15}$ is infinity (i.e., open-circuited). Furthermore, for this condition, the remaining component values must be adjusted so that $$R_{17}=3.03R_{16}$$

$$C_6=0.479\ t_c/R_{16}$$

$$C_7=0.273C_6$$

$$R_{16}=\text{unrestricted}$$

under the constraint that $t'_c<t_1$. The dc gain of this filter is one. However, other choices of componet values may be used without compromising the amplitude- and rise-time compensation of the filter provided that $t_c<t_1$.

Figure 13:
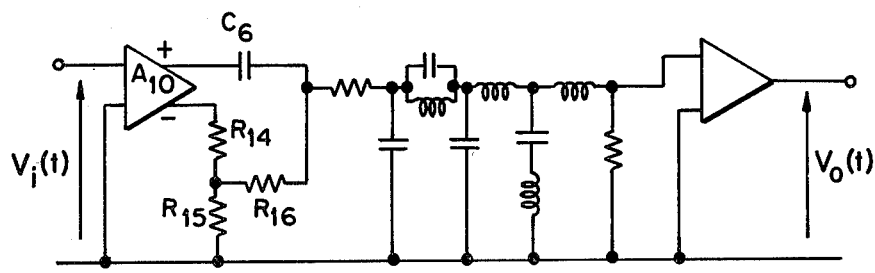

As with the previously discussed embodiments, the simple low-pass filter $R_{17}$-$C_7$ of FIG. 12 can be replaced with a more complex low-pass filter. Reference should be made to FIG. 13, wherein the relatively complex RLC filter, shown in unlabeled components, is a substitute for the simple low-pass filter $R_{17}$-$C_7$ of FIG. 12.

Figure 14:
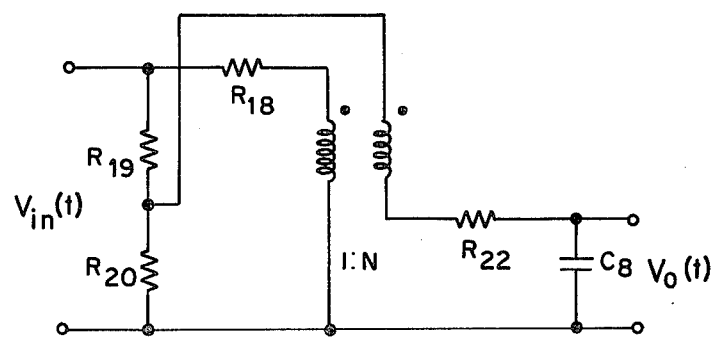

Finally, the use of differential-input and balanced-output amplifiers can be eliminated by using transformers. In addition to the use of wide-band transformers as phase inverters, the finite primary inductance can be used as part of a combination R-L differentiator and phase inverter, as shown in FIG. 14. The "dots" on the transformer windings of FIG. 14 are located consistent with conventional use to indicate the relative direction of transformer windings.

The resistors $R_{19}$ and $R_{20}$ form a voltage divider that determines the fraction of the non-differentiated signal that is subtracted from the differentiated signal to result in the final output signal. The resistor $R_{18}$ together with the open circuit primary inductance form an R-L differentiator. The direction of the transformer windings, as indicated by the dots, reverses the polarity of the differentiated signal with respect to the non-differentiated signal. The subtraction is done by proper connection of the transformer secondary winding to the junction of resistors $R_{19}$ and $R_{20}$. The resistor $R_{19}$ can be made 0 ohms and the resistor $R_{20}$ can be eliminated by proper choice of the other component values.

For excitation by a voltage source, for b/c=3, and hence for a signal-to-noise ratio that is only 3.5% worse than that of the optimum discussed under FIG. 7, the following component values should be used:

Transformer turns ratio=4:1 with secondary having larger number of turns;
Transformer coefficient of coupling $\approx 1.0$
$R_{19}=0$
$R_{20}=$ any value or omitted;
Transformer primary inductance $=0.159R_{18} t_c$;
$R_{22}=39.6 R_{18}$; and
$R_{22}C_8=0.845t_c$.

Other component values may produce the rise-time-compensated zero-crossing time. However, most other component values will produce a worse signal-to-noise ratio. The value of $R_{18}$ is not specified. Its value may be chosen to match a given transformer primary inductance or to set the network impedance level. The dc gain is one for the component values given. The choice of the transformer turns ratio equal to 4 is somewhat arbitrary. However, the dc gain must be reduced below one by use of an $R_{19}$-$R_{20}$ attenuator if the turns ratio is less than 3. Otherwise, negative component values are required.

For excitation by a current source, for b/c=3, and for the same signal-to-noise ratio, the following component values should be used:

Transformer turns ratio=N with the secondary having the larger number of turns.
Transformer coefficient of coupling $\approx 1.0$
$R_{19}=0$
$R_{20}=$ omitted
Transformer primary inductance $=0.478R_{18}t_c/(N-1)$
$R_{22}=(2.54N-3.54)R_{18}$
$R_{18}C_8=0.396 t_c/(N-1)$ Although the present invention has been shown and described in terms of various specific embodiments, it will be appreciated by those skilled in the art that changes or modifications are possible which do not depart from the inventive concepts described and taught herein. Such changes and modifications are deemed to fall within the purview of these inventive concepts. For example, although the filter described herein includes discrete circuit components, is it not to be limited thereto and may be implemented by various microelectronic designs. Further, differentiation of the input signals may be accomplished by other than RC differentiators, such as suitable RL differentiators, or other circuitry. Still further, the present invention could be implemented by use of digital, as well as analog, means. The invention is defined solely by reference to the appended claims, and equivalents thereto.

I claim:

1. An amplitude-compensated, rise-time-compensated filter for converting an input pulse, having a substantially linear leading edge, to a bipolar output pulse, the filter comprising,
    differentiator means for differentiating the input pulse; and subtractor means for subtracting a pulse directly proportional to the input pulse from the differentiated input pulse, to form an output pulse having a fixed zero crossing time relative to the time of occurance of the input pulse that is invariant with the amplitude or rise time of the input pulse.

2. The filter of claim 1, wherein said subtractor means comprises means for obtaining a fraction of the input pulse and differencing means for obtaining the difference between the differentiated input pulse and the fraction of the input pulse.

3. The filter of claim 2, wherein said means for obtaining a fraction of the input pulse comprises a divider network.

4. The filter of claim 2, wherein said differencing means comprises a differential amplifier having a first input operatively connected with said differentiator means and a second input operatively connected with said means for obtaining a fraction of the input pulse.

5. The filter of claim 1, wherein said differentiator means comprises an RC differentiator network.

6. The filter of claim 1, further comprising low-pass filter means for passing the frequencies of the input pulse.

7. The filter of claim 6, wherein said low-pass filter means is a separate filter section following the subtractor means.

8. The filter of claim 6, wherein said low-pass filter means precedes said differentiator means.

9. The filter of claim 1, wherein said subtractor means comprises means for reversing the polarity of the input pulse to obtain a pulse equal in magnitude, but of opposite polarity, means for obtaining a fraction of the opposite polarity pulse, and means for summing the opposite polarity pulse with the differentiated input pulse to obtain the output pulse.

10. The filter of claim 9, wherein said means for reversing the polarity of the input pulse comprises a balanced-output amplifier having an input-terminal means for receiving the input pulse, and positive and negative output terminals, the positive terminal operatively connected with said differentiating means and the negative terminal operatively connected to said means for obtaining a fraction of the opposite polarity pulse.

11. An amplitude-compensated, rise time-compensated filter for receiving an input pulse having a substantially linear leading edge and non-zero rise time and for converting said input pulse to a bipolar output pulse having a zero-crossing time that is independent of the amplitude and rise time of the input pulse, said filter comprising,
    input means for receiving said input pulse;
    differentiator means operatively coupled with said input means for differentiating said input pulse;
    proportioning means operatively coupled with said input means for obtaining a signal which is a constant fraction of said input pulse;
    differencing means operatively coupled with said differentiator means and said proportioning means for obtaining an output pulse, said output pulse comprising the difference between the differentiated input pulse and the signal which is a constant fraction of the input pulse; and
    output means for receiving the output pulse.

12. The filter of claim 11, wherein said differentiating means differentiates the linear leading edge of the input pulse.

13. The filter of claim 12, further comprising an isolation amplifier coupled between said input means and said differentiator and proportioning means.

14. The filter of claim 12, wherein said output means is coupled with a level-crossing discriminator.

15. The filter of claim 12, further comprising a low-pass filter coupled between said differencing means and said output means.

16. The filter of claim 13, further comprising a low-pass filter coupled between said isolation amplifier and said differentiator and proportioning means.

17. An amplitude-compensated, rise-time-compensated filter for receiving an input pulse having a substantially linear portion during the leading edge and non-zero rise time and for converting said input pulse to a bipolar output pulse having a zero-crossing time that is independent of the amplitude and rise time of the input pulse, said filter comprising,
  input means for receiving said input pulse;
  balanced-amplifier means operatively coupled with said input means for providing a positive-polarity pulse proportional to the input pulse and a negative-polarity pulse proportional to the input pulse;
  differentiator means operatively coupled with said balanced-amplifier means for receiving and differentiating the positive-polarity pulse;
  proportioning means operatively coupled with said balanced-amplifier means for receiving said negative-polarity pulse and for obtaining a constant fraction thereof;
  summing means operatively coupled with said differentiator means and said proportioning means for obtaining said output pulse by summing the differentiated positive-polarity pulse with the fractional negative-polarity pulse; and
  output means for receiving the output pulse.

18. A method for converting an input pulse having a substantially linear leading edge to a bipolar output pulse having a zero-crossing independent of the amplitude and rise time of said input pulse, comprising the steps of:
  generating a first signal which is the derivative of said input pulse;
  generating a second signal which is a constant fraction of said input pulse; and
  generating said bipolar output pulse by subtracting said second signal from said first signal to force the zero-crossing of said bipolar output pulse at a fixed time relative to the occurrence of said input pulse.

* * * * *